United States Patent [19]
Vokey et al.

[11] Patent Number: 5,708,364
[45] Date of Patent: Jan. 13, 1998

[54] CABLE MONITORING SYSTEM WITH MULTIPLE BRANCH TERMINATIONS

[76] Inventors: David E. Vokey, 1026 Northwind Cir., Bellingham, Wash. 98226; Kenneth N. Sontag, Box 21, Group 529, R.R. 5, Winnipeg, Manitoba, Canada, R2C 2Z2; Gilles Aminot, Box 636, Ile de Chenes, Manitoba, Canada, R0A 0T0

[21] Appl. No.: 510,239

[22] Filed: Aug. 2, 1995

[30] Foreign Application Priority Data

Jun. 6, 1995 [CA] Canada ................ 2.151.094

[51] Int. Cl.$^6$ .................. G01R 31/02; H04B 3/46
[52] U.S. Cl. .......... 324/523; 324/524; 324/527; 324/543; 379/26; 379/29
[58] Field of Search .................. 324/509, 512, 324/522, 523, 524, 527, 543, 544; 340/647, 650, 651, 652; 379/26, 29

[56] References Cited

U.S. PATENT DOCUMENTS

| | | | |
|---|---|---|---|
| 2,752,590 | 6/1956 | Towle | 340/647 |
| 4,446,421 | 5/1984 | Berde | 324/523 |
| 4,480,251 | 10/1984 | McNaughton et al. | 324/525 X |
| 5,066,919 | 11/1991 | Klassen et al. | 324/538 |
| 5,077,526 | 12/1991 | Vokey et al. | 324/541 |
| 5,179,342 | 1/1993 | Wolfe et al. | 324/533 |
| 5,612,624 | 3/1997 | Clinton | 324/544 |

*Primary Examiner*—Glenn W. Brown
*Attorney, Agent, or Firm*—Murray E. Thrift; Adrian D. Battison

[57] ABSTRACT

A novel method and apparatus are used for monitoring cables for wear and damage. The system is particularly applicable to a cable system with multiple branch terminations. The cables have detection conductors, for example the metal cable jackets or other detection conductors extending the length of the conductors. These are connected electrically at the splice points in the system. At the end of each branch and at the end of the main cable, the detection conductors are each connected to a novel termination circuit. In the normal monitoring mode, the termination circuit appears as an open circuit. A DC voltage is normally applied to the detection conductors. Any current is a result of current leakage at a resistive fault along the detection conductors. The termination circuits are activated by altering the DC voltage, e.g. by reversing the polarity and increasing the magnitude of the voltage. This causes the termination circuit to perform a series of functional tests. These include a loop test which places a short across the end of the detection conductor for a timed period. The resulting high level loop current is used to calculate the total detection conductor resistance. A second test transmits a coded signal simulating a triggered splice sensor unit. The signal is detected and decoded to verify proper operation of end to end coded signaling after completing a test cycle, the termination circuit turns off and the next termination to be tested is addressed.

22 Claims, 5 Drawing Sheets

CABLE MONITORING SYSTEM WITH MULTIPLE BRANCH TERMINATIONS

FIELD OF THE INVENTION

The present invention relates to the monitoring of communications cables for damage.

BACKGROUND

Telephone and communication cables are subject to damage and wear from environmental conditions and man made causes. Severe weather conditions such as high winds, snow, icing, rain, floods, and lightning can damage exposed cables. Damage can occur from nearby construction or by vandalism. The ingress of rain or ground water into the cable core or splice closure at damage locations is a major cause of outages. Every effort is made to keep the cable in good repair and water out of the cable structure.

Maintenance monitoring systems have been used to detect and provide early warning of cable trouble. In one known method of monitoring a communications cable for damage, a DC voltage is applied to one end of a detection conductor extending the length of the cable and currents in the detection conductor are monitored to detect faults in the cable.

For filled telephone cables, an electronic monitoring method of this type and apparatus for carrying it out were developed as described by McNaughton et al. in U.S. Pat. No. 4,480,251, issued 30 Oct., 1984. This early system used especially designed moisture detection conductors and a termination resistor at the remote end of the monitored cable section. Another system, described by Vokey and Sontag in U.S. Pat. No. 5,077,526, issued 31 Dec., 1991, uses the armor on a fiber optic cable in a ground return configuration with a termination resistor to ground at the far end of the monitored cable armor.

For these earlier systems, the termination resistor at the remote end of the monitored conductor(s) creates a continuous loop back path through which a "nominal" monitoring current flows. The continuous loop current is used to check for line continuity to the end of the cable section. A monitoring current "window" is established. If the loop current drops below a minimum value, which is typically set at half of the nominal loop current as established by the termination resistor, then the line is considered "open" and is not electrically continuous for monitoring purposes. If the loop current exceeds a maximum level, as a result of a "fault" at a point long the monitored detection conductor(s), then the cable is considered damaged and in need of repair. The increase in current from the nominal set point to cause "fault" alarm is on the order of 1 mA while the decrease in current from the nominal set point to cause an "open" alarm is about 0.25 mA.

To avoid an undesirably high loop current, the loop back termination resistor for the earlier system was chosen to provide a small nominal loop current of about 0.5 mA. The "open" condition was established when the current decreased by about 0.25 mA. For a typical system, this would require an increase in the loop resistance of about 250,000 ohms before an "open" would be detected. Due to this lack of sensitivity to in series resistance increases, an increase of resistance in a monitored conductor joint on the order of 10 ohms, which is considered significant, can not be detected.

For distribution cables, both copper and fiber optic, it is common for a large number of branch cables to extend from the main cable. The earlier systems require a termination resistor at the end of each branch cable to monitor for continuity of that section. As the number of terminated branch cables grows, the total nominal loop current increases proportionally. As the total nominal loop current becomes large, the "open" and "faulted" current limits are swamped by the "nominal" loop current. For systems with 5 or more termination resistors, the current increase of 1 mA for a "fault" condition and the current decrease of 0.5 mA for an "open" condition represent only a small fraction of the nominal loop current and become impractical to implement. Additionally, if any small fault current exists on any section of cable, a decrease of 0.25 mA which would normally indicate an "open" condition may not be detected as the system responds only to the total sum of the currents and the small fault current increase will cancel out an equal portion of current decrease.

SUMMARY

The present invention is concerned with mitigating these limitations and problems.

According to one aspect of the present invention, there is provided a method of monitoring a communications cable for damage, the cable having a detection conductor therealong with a monitored end and a remote end, the method including the steps of applying to the monitored end of the detection conductor a DC voltage with respect to ground and monitoring currents in the detection conductor to detect faults in the cable, characterized by:

normally isolating the detection conductor to prevent DC currents in the detection conductor;

selectively altering the DC voltage applied to the detection conductor;

detecting the altered DC voltage at the remote end of the detection conductor;

electrically connecting the detection conductor to ground at the remote end of the detection conductor in response to detection of the altered DC voltage; and measuring current in the detection conductor.

According to another aspect of the present invention there is provided a monitoring system for a communications cable having a monitored end, a remote end and a detection conductor extending along the cable from the monitored end to the remote end, the system comprising means for applying a DC voltage to the detection conductor at the monitored end and means for monitoring currents in the detection conductor, characterized by:

the detection conductor being normally isolated such that no current is carried by the detection conductor;

means for selectively altering the DC voltage applied to the detection conductor; and termination means coupled to the detection conductor at the remote end of the cable and responsive to the selective alteration of the DC voltage on the detection conductor to connect the detection conductor to ground at the remote end of the cable.

The terminating resistor of the earlier systems is thus replaced with a termination circuit placed at the end of the detection conductor. In the normal monitoring mode, the termination circuit appears as an open circuit. There is no requirement for a nominal loop current to monitor continuity. With this method, any loop current is a direct result of a resistive fault along the detection conductor which is directly caused by cable damage. There is no large nominal loop current to "swamp" changes in the monitoring current caused by small resistive faults. This allows, in theory, an unlimited number of branch cables to be connected to, and monitored, along with the main cable. When activated, the termination completes a current path through the detection conductor, allowing the detection of an "open" fault.

According to another aspect of the present invention there is provided a method of monitoring a communications cable system including a main cable and a plurality of branch cables, each with a detection conductor extending therealong, the detection conductors being electrically connected, and a plurality of branch termination means connected to the respective branch detection conductors at terminal ends of the respective branches, said method comprising:

applying a voltage to the detection conductor of the main cable;

actuating the branch termination means with a signal applied to the detection conductor of the main cable;

causing the branch termination means to connect to ground the individual branch detection conductors individually and at separate times; and measuring current in the detection conductor of the main cable.

According to a further aspect of the present invention there is provided a monitoring system for a communications cable system including a main cable with a monitored end and a plurality of branch cables coupled to the main cable, each of the main and branch cables having a detection conductor extending therealong, the detection conductors being electrically connected, said monitoring system comprising means for applying a DC voltage to the monitored end of the main cable detection conductor, means for monitoring currents in the main cable detection conductor and a plurality of termination means connected to the respective detection conductors at ends thereof, the system being characterized in that:

each termination means has a non-actuated state maintaining an open circuit to ground and an actuated state connecting the associated detection conductor to ground; and the system includes actuating means for selectively actuating the termination means to the actuated state.

The method and apparatus thus use a termination circuit placed at the end of the detection conductors on the main cable and every monitored branch cable. In the normal monitoring mode, the termination circuit appears as an open circuit. There is no requirement for a nominal loop current to monitor continuity which allows, in theory, an unlimited number of branch cables to be connected to, and monitored along, with the main cable.

The step of altering the DC voltage applied to the detection conductor may include reversing the polarity of the DC voltage to activate the termination circuits. The DC voltage may also be increased to a level adequate to test for resistive faults and to power all of the termination circuits.

To test for proper operation of end to end signaling, a coded signal may be applied to the detection conductor by the actuated termination circuit and monitored at the monitored end of the detection conductor.

In a multiply branched system, the branch termination circuits may be actuated simultaneously, and configured to connect the respective detection conductors to ground in a timed sequence. Alternatively, the branch termination means may be actuated in sequence with coded signals applied to the detection conductor of the main conductor.

In the preferred embodiment of the invention, reversing the DC monitoring polarity and signaling a selected termination activates the termination to perform a series of functional tests. One such test is a loop test which places a direct or a low resistance short across the end of the detection conductor for a timed period. This results in a high level loop current which is measured and used to calculate the total detection conductor resistance. The resulting high loop current allows a loop resistance measurement to within a fraction of an ohm. The detection conductor resistance along with any increase in conductor joint resistance can be accurately measured and tracked thus providing important information on the cable condition. A second test transmits a coded signal simulating a triggered splice sensor unit for a predetermined time. The signal is detected and decoded to verify proper operation of end to end coded signaling. After competing the test cycle, the termination circuit turns off and the next termination to be tested is signaled.

The invention thus provides a method and apparatus for monitoring a cable for faults without a continuous loop current. Consequently it may be used means to monitor a main cable along with a large number branch cables. Preferred embodiments of the invention also perform a rigorous loop test on every cable section and can detect small changes in the series resistance of the monitored conductors to effectively detect defective conductor joints.

According to a further aspect of the invention, there is provided a termination circuit for a communication cable having a detection conductor extending therealong, said termination circuit comprising:

monitoring terminal means for connecting the termination circuit to the monitored conductor;

ground terminal means for connecting the termination circuit to ground;

grounding means for producing a resistance path between the monitoring terminal and the ground terminal in response to receipt of an actuating signal at the monitoring terminal; and means for inhibiting operation of the grounding means and maintaining the termination means as an open circuit in response to the monitoring circuit having a negative potential with respect to the ground terminal.

The novel circuit is used in the system to provide the requisite functions at the remote end of each cable branch.

BRIEF DESCRIPTION OF THE DRAWINGS

In the accompanying drawings, which illustrate a prior art cable monitoring system and exemplary embodiments of the present invention.

DETAILED DESCRIPTION

Figure 1:
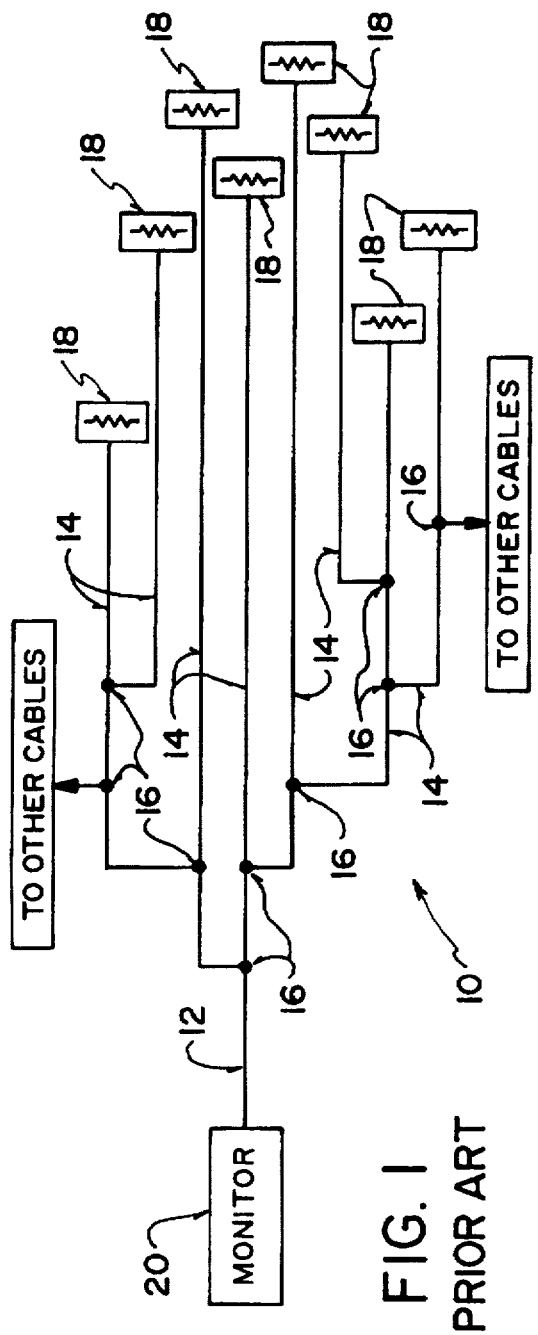
FIG. 1 is a schematic of a prior art system.

Referring to the accompanying drawings, FIG. 1 illustrates a prior art distribution cable system 10. The system includes a main cable 12 and a large number of branch cables 14 extending from the main cable and connected to it by splices 16. The system includes termination resistors 18 at the remote ends of the main cable and each branch cable to monitor for continuity of the respective cable sections. The resistors are connected to detection conductors, e.g. cable jackets or special moisture detecting conductors, extending along the cables. The detection conductors are electrically connected at the splices 16.

A monitoring station 20 at the inner end of the main cable applies a DC voltage to the detection conductor. This voltage produces a loop current through the detection conductors, the resistors and a return path, which may be ground or a second conductor. The loop current is monitored to monitor the condition of the cable.

As the number of terminated branch cables grows, the total nominal loop current increases proportionally. As the total nominal loop current becomes large, the "open" and "faulted" current limits are swamped by the "nominal" loop current. For systems with five or more termination resistors, the current increase of 1 mA for a "fault" condition and the current decrease of 0.5 mA for an "open" condition represent only a small fraction of the nominal loop current and become impractical to implement. Additionally, if any small fault current exists on any section of cable, a decrease of 0.25 mA which would normally indicate an "open" condition may not be detected as the system responds only to the total sum of the currents and the small fault current increase will cancel out an equal portion of current decrease.

Figure 2:
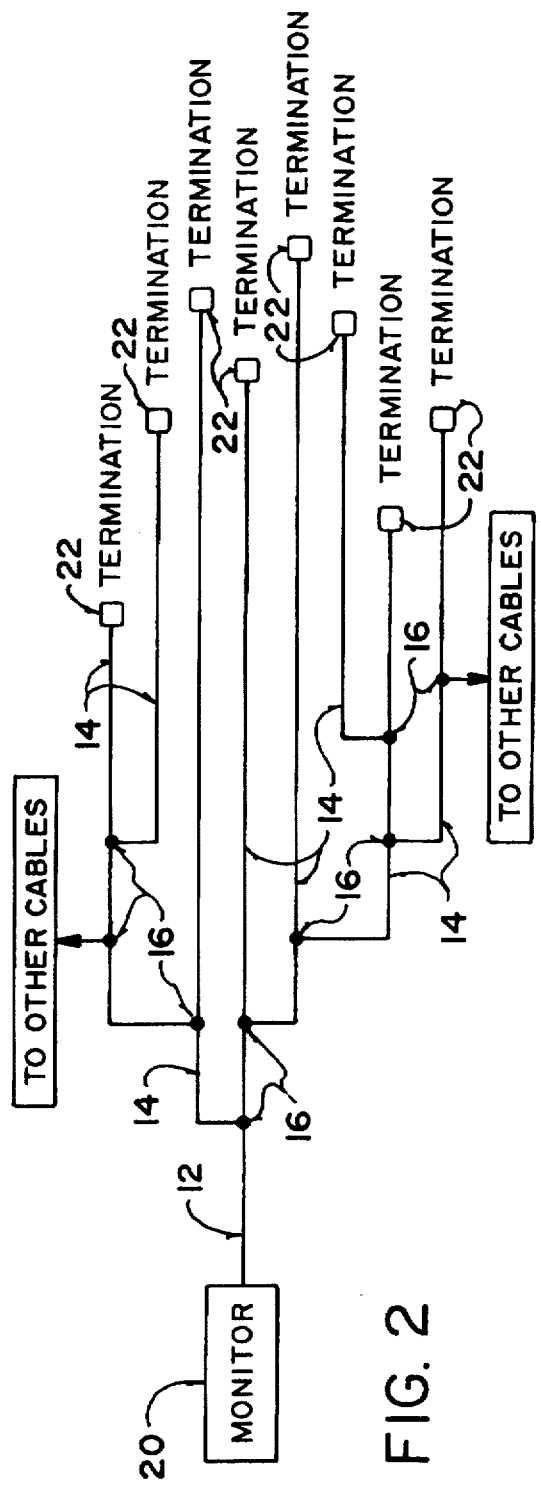
FIG. 2 is a schematic of a system according to the present invention.
Figure 5:
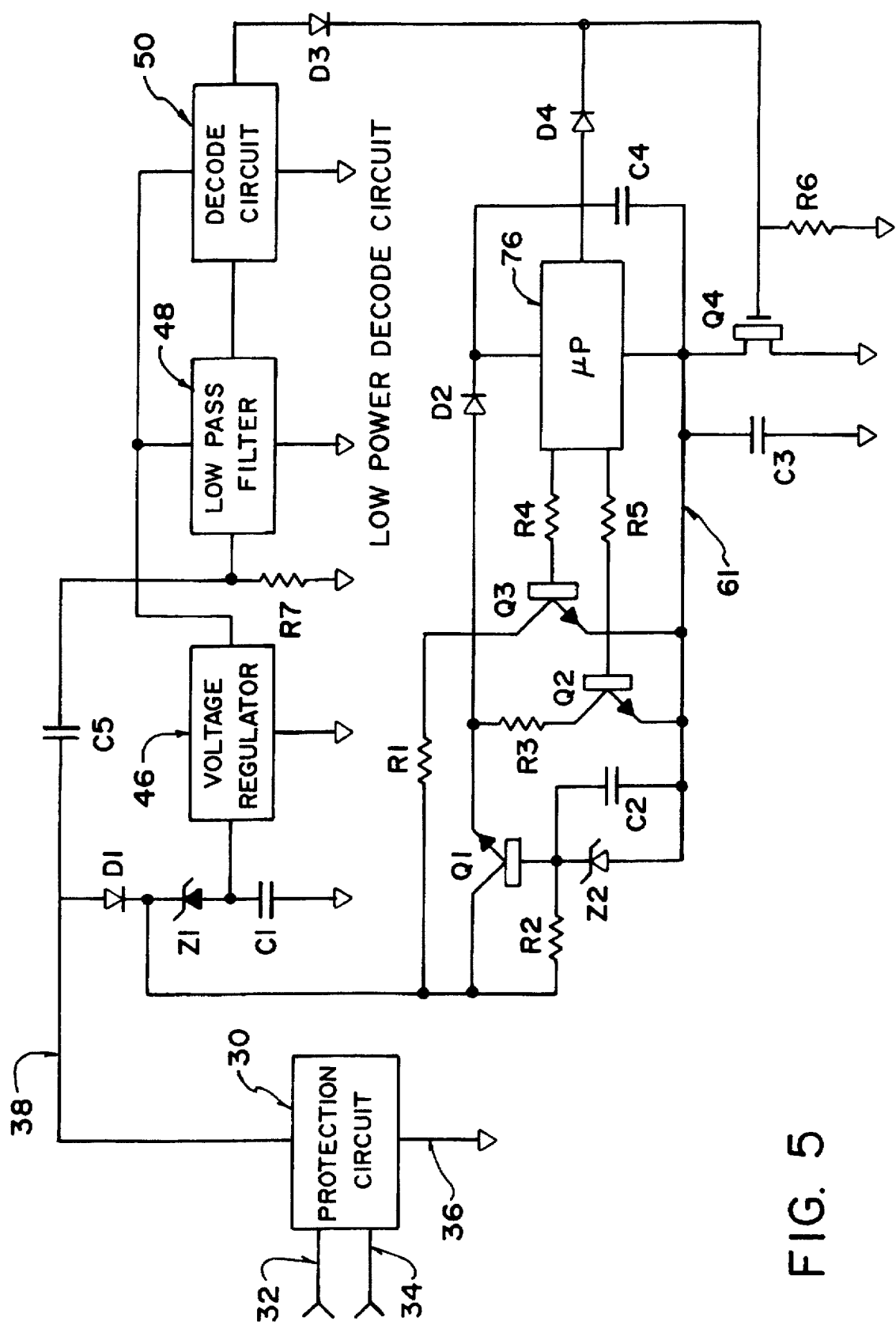
FIG. 5 is a schematic of an addressable termination circuit.

A preferred embodiment of the invention is illustrated in FIGS. 2, through 5.

Figure 3:
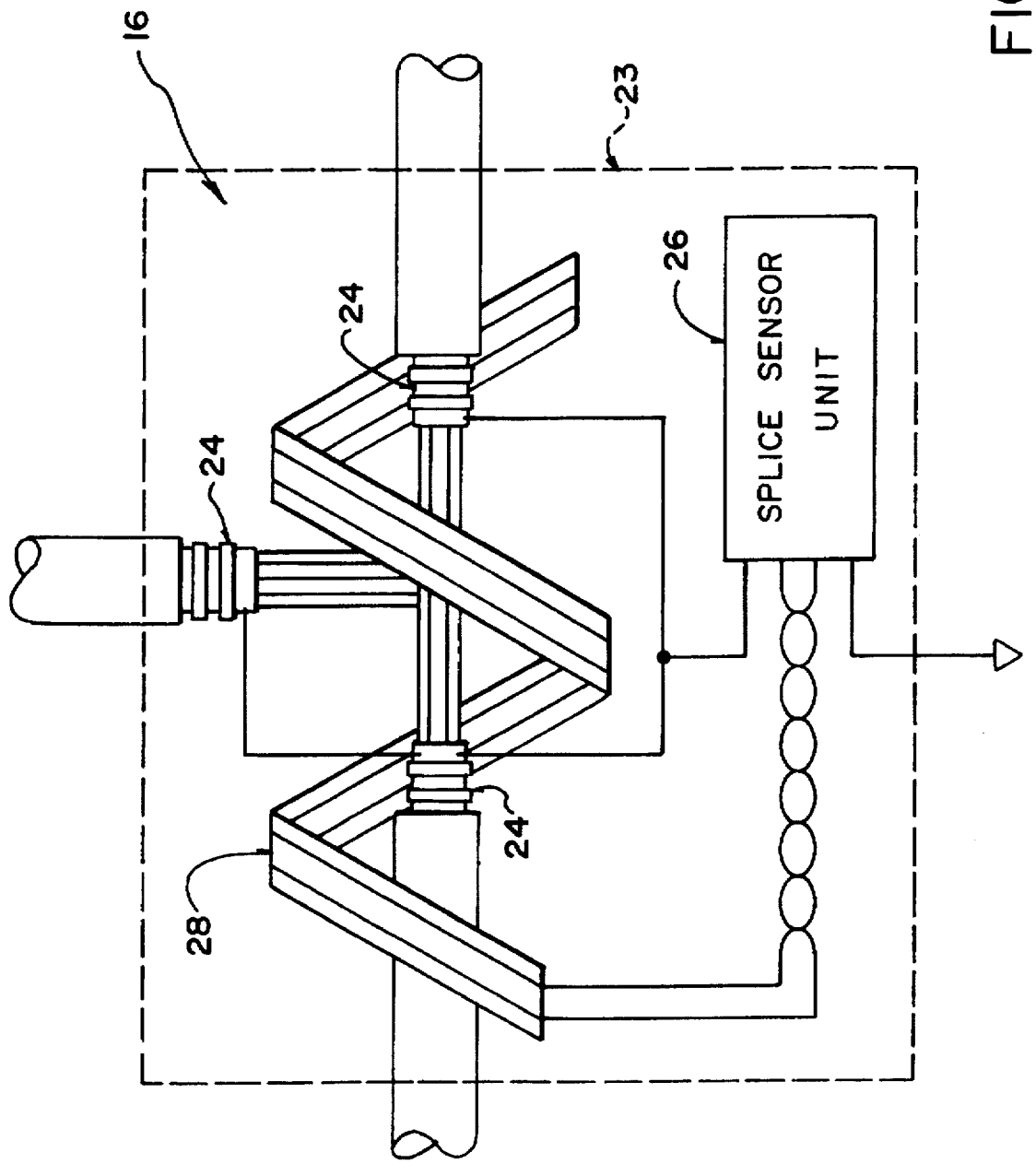
FIG. 3 illustrates a splice enclosure.

As shown in FIG. 2, termination circuits 22 replace the resistors 18 of the prior art system in the distribution cable system 10. FIG. 3 illustrates a splice enclosure 23. This is essentially the same as the splice monitoring arrangement described in U.S. Pat. Nos. 4,480,251 and 5,077,526, referred to above. As in the latter patent, a metallic armor layer 24 is used as a detection conductor providing complete end to end monitoring of the cable. The armor layer is connected to the monitoring station 20 and the termination circuit 22 at opposite ends of the main cable as shown in FIG. 2. The branch cable detection conductors are connected at their remote ends to respective termination circuits 22 and to other detection conductors at the splices 16.

In each splice enclosure 23 there is a remote splice sensor unit (SSU) 26, connected to a moisture detection tape 28 that is wrapped around the splice bundle. When water contacts the tape, the remote sensor unit is triggered to transmit a 32-baud digitally encoded alarm signal to the office terminal through the cable armor. The monitoring station intercepts, decodes, and displays the exact location of the trouble.

Figure 4:
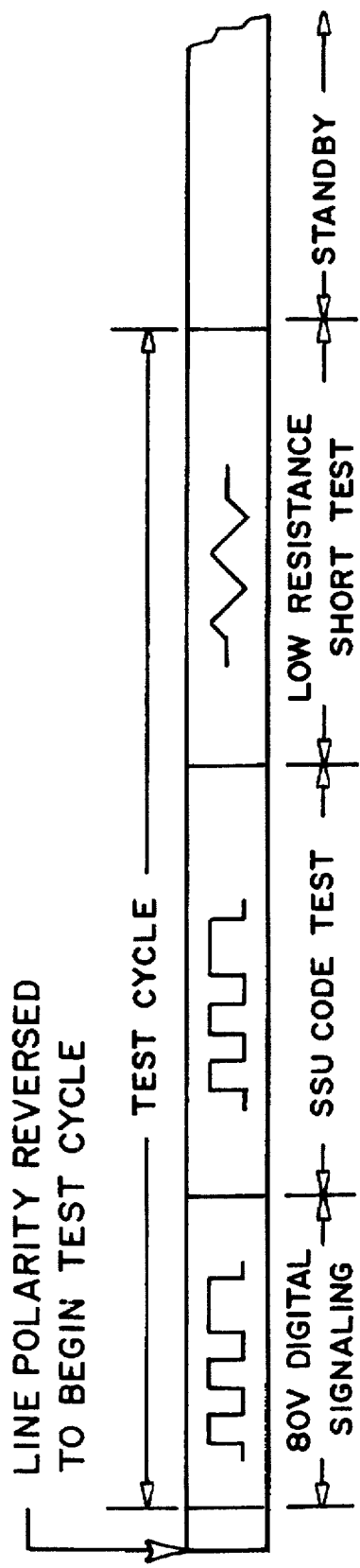
FIG. 4 is a schematic illustration of a termination test cycle.

Referring to FIG. 4, the sequence of events for a complete termination test cycle is as follows:

1. Line polarity is reversed and made positive with respect to ground.
2. The line voltage is increased from a nominal of 50 V DC to about 80 V DC, which activates the signaling circuit in the termination units.
3. A pulsed digital code is transmitted to activate the termination with the corresponding address code.
4. The termination sends a sensor unit code corresponding to its address code for a predetermined test period.
5. The line is shorted for a test interval by a fixed value termination resistor.
6. The termination test cycle ends and the termination goes into low current standby.
7. The sequence from step 2 to step 6 is repeated for every termination to be tested.
8. After completing all termination tests, the line is returned to a negative polarity with respect to ground and the normal monitoring function is resumed.

In addition to transmitting the code assigned to it, the termination may also transmit a digitally coded number corresponding to a measured quantity such as resistance, voltage, pressure, temperature etc. This telemetering function is useful in applications where the termination is placed at a remote equipment site, such as an optical node in a broadband transmission system, thereby providing a means to measure and relay back performance information.

The circuit schematic for the termination circuit is illustrated in FIG. 5.

The circuit includes a protection circuit 30 that protects the termination against high voltage transients and the like. It has a terminal 32 coupled to the detection conductor and a return path terminal 34 connected to either the return conductor or a ground return path. The protection circuit has a ground connection 36. A signal line 38 leads from the protection circuit to the anode of a diode D1. The cathode of diode D1 is connected to the anode of zener diode Z1. The anode of the zener is connected to a grounded capacitor C1 and to the input of a voltage regulator 46. The voltage regulator is a power supply for a low pass filter 48 and a decoder circuit 50. The input to the low pass filter is taken from the signal line 38 through an RC filter consisting of capacitor C5 and resistor R7. The output of the low pass filter 48 is passed to the input of the decoder circuit 50.

The decoder circuit output is connected to a diode D3, the cathode which is connected to ground through a resistor R6. The output of the diode is also connected to the gate of a mosfet Q4 connected between ground and a circuit ground line 61. The ground line 61 is also connected to ground through a capacitor C3.

Line 61 leads to an emitter follower voltage regulator formed by a transistor Q1, a resistor R2 connecting the collector and base of the transistor and zener Z2 and capacitor C2 connecting the base to the line 61. The collector of transistor Q1 is connected to the signal line 38 through diode D1. The transistor emitter is connected through a diode D2 to a microprocessor 76. The microprocessor, when turned on, delivers a positive output to a diode D4 which is connected to the gate of mosfet Q4. The microprocessor is also connected to a modulator circuit 82 including a resistor R5 connected to the base of a transistor Q2. The transistor emitter is connected to the line 61 while its collector is connected through a resistor R3 to the emitter of transistor Q1.

The microprocessor has a further output connected through a resistor R4 to the base of a transistor Q3. The emitter of the transmitter is connected to line 61, while its collector is connected through a test resistor R1 to the signal line 38 through diode D1.

The operation of the addressable termination circuit is as follows:

A positive voltage of about 80 V DC is applied to the circuit. D1 is forward biased and the zener diode Z1 conducts applying about 20 V DC across the voltage regulator circuit. The voltage regulator outputs a constant 12 V DC, powering the low pass filter 48 and decode circuit 50. These circuits use low power microwatt ($\mu$W) integrated circuits to minimize the loading on the monitored line. This allows a large number of termination circuits to be powered up simultaneously. The terminal equipment then transmits a Manchester binary address code to all terminations circuits on the line. The signal is capacitively coupled through C5 to the low pass filter which removes noise and reshapes the pulses before passing them on to the decode circuit. The decode circuit reads the binary address code and compares it to the preset address of the termination. If the address code matches the internal code, the decode circuit outputs a positive voltage to diode D3 which becomes forward biased applying a positive voltage to the gate of the MOSFET Q4. The MOSFET turns on thereby applying the line voltage across the emitter follower voltage regulator formed by Q1, R2, Z2 and C2. The output of the regulator is applied via D2 to the microprocessor 76 which begins a preprogrammed test sequence. The microprocessor outputs a positive voltage to the base of MOSFET Q4 through diode D4 to keep the circuit turned on. At this time the line voltage is reduced to the about 50 volts thereby turning off the decode circuit while the test circuit remains operational. The microprocessor outputs a pulsed address code to the modulator circuit formed by R5, Q2, and R3. This sends a return response to the terminal equipment thereby verifying the responding termination address code. After repeating the address code for about 10 seconds, the microprocessor outputs a positive voltage to resistor R4 turning on Q3 which places a test resistor R1 across the line. This results in a line current test of up to 15 mA for several seconds to allow the terminal equipment to compute the line resistance and test the splice joins for high resistance. After completing the test cycle the microprocessor removes the positive voltage to Q4 thereby switching off the entire termination circuit.

Figure 6:
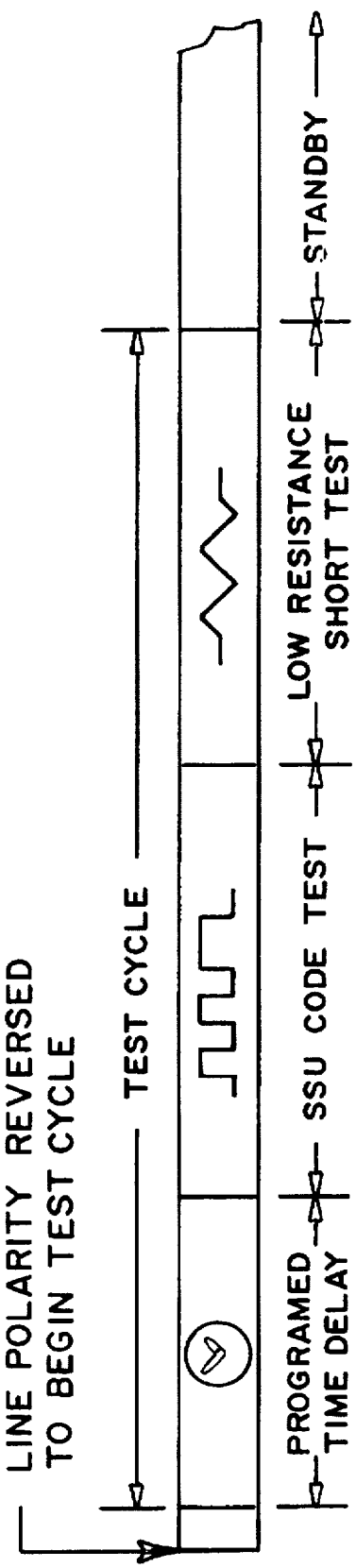
FIG. 6 is a schematic illustration of an alternative termination test cycle.
Figure 7:
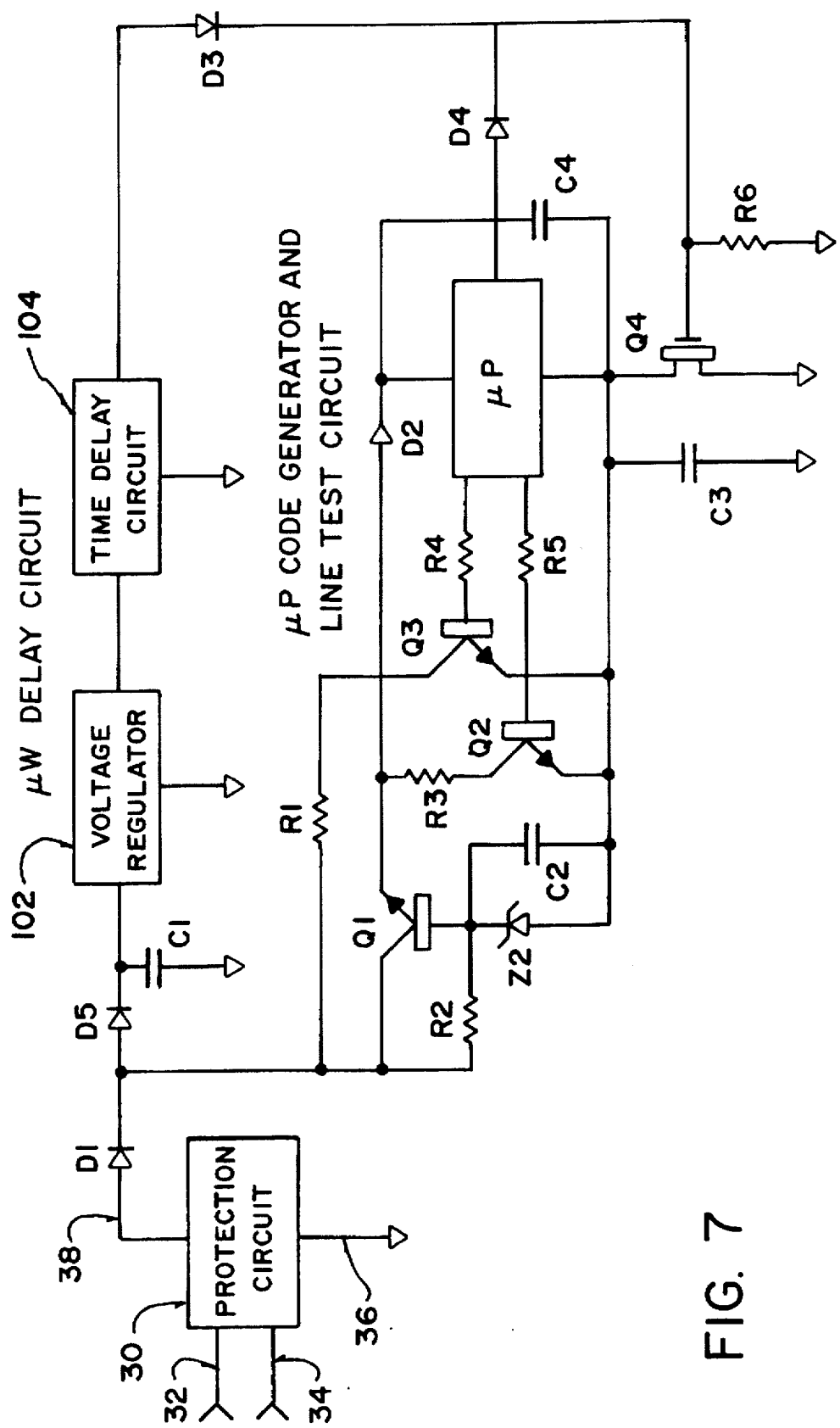
FIG. 7 is a schematic of an alternative addressable termination circuit.

An alternative embodiment of the invention is illustrated in FIGS. 6 and 7. In this embodiment the termination does not respond to an address code but instead operates after a predetermined time delay.

Referring to FIG. 6, the sequence of events for a complete termination test cycle is as follows:

1. Line polarity is reversed to activate all termination units.
2. After N×Tc seconds the termination initiates the test sequence
   where:
   N is the code number of the termination
   Tc is the time in seconds for a complete test cycle.
3. The termination sends a sensor unit code for a predetermined test period.
4. The line is shorted for a test interval by a fixed value termination resistor.
5. The termination test cycle ends and the termination goes into standby.

In addition to transmitting the code assigned to it, the termination may also transmit a digitally coded number corresponding to a measured quantity such as resistance, voltage, pressure, temperature etc. This telemetering function is useful in applications where the termination is placed at a remote equipment site, such as an optical node in a broadband transmission system, thereby providing a means to measure and relay back performance information.

Referring to circuit diagram in FIG. 7, the alternative sequenced termination circuit 96 includes a protection circuit 30, signal line 38 and diode D1 like those of the circuit of FIG. 4. In this case, the output of diode D1 is delivered through a diode D5 to a grounded capacitor C1 and the input of a voltage regulator 102. The voltage regulator output is delivered to a time delay circuit 104 which delivers its output to diode D3 corresponding to diode D3 of the embodiment of FIG. 5.

The operation of the sequenced termination circuit is as follows:

A positive voltage of about 50 V DC is applied to the monitored detection line. Diodes D1 and D5 are forward biased and the line voltage is applied to the voltage regulator 102 of the low power time delay circuit 104. The voltage regulator provides a constant voltage of about 5 V DC to the time delay circuit. The time delay circuit activates and begins a time delay countdown. At the end of the predetermined countdown, the time delay circuit outputs a single positive pulse to diode D3 which turns on MOSFET Q4. The rest of the circuit the operates as described in the addressable termination circuit. The terminations are designed such that the time delays are programmed to avoid test cycle overlap as the termination operate in sequence.

While certain embodiments of the present invention have been described in the foregoing, it is to be understood that other embodiments are possible within the scope of the invention. The invention is to be considered limited solely by the scope of the appended claims.

We claim:

1. A method of monitoring a communications cable for damage, the cable having a detection conductor therealong with a monitored end and a remote end, the method comprising:

preventing DC currents in the detection conductor;

applying to the monitored end of the detection conductor a DC voltage with respect to ground;

selectively altering the DC voltage applied to the detection conductor;

detecting the altered DC voltage at the remote end of the detection conductor;

electrically connecting the detection conductor to ground at the remote end of the detection conductor in response to detection of the altered DC voltage; and measuring current in the detection conductor to detect faults in the cable.

2. A method according to claim 1 further comprising:

applying a coded signal to the remote end of the detection conductor; and monitoring the coded signal at the monitored end of the detection conductor.

3. A method according to claim 1 wherein the step of altering the DC voltage applied to the detection conductor comprises reversing the polarity of the DC voltage.

4. A method according to claim 3 wherein the step of altering the DC voltage applied to the detection conductor further comprises increasing the DC voltage.

5. A method of monitoring a communications cable system comprising a main cable and a plurality of branch cables, each with a detection conductor extending therealong, the detection conductors being electrically connected, and a plurality of branch termination means connected to the respective branch detection conductors at terminal ends of the respective branches, said method comprising:

applying a voltage to the detection conductor of the main cable;

actuating the branch termination means with a signal applied to the detection conductor of the main cable;

causing the branch termination means to connect to ground the individual branch detection conductors individually and at separate times; and measuring current in the detection conductor of the main cable.

6. A method according to claim 5 comprising actuating the branch termination means simultaneously and causing the branch termination means to connect to ground the respective detection conductors in a timed sequence.

7. A method according to claim 5 comprising actuating the branch termination means in sequence with sequential signals applied to the detection conductor of the main conductor.

8. A monitoring system for a communications cable having a monitored end, a remote end and a detection conductor extending along the cable from the monitored end to the remote end, the system comprising means for applying a DC voltage to the detection conductor at the monitored end and means for monitoring currents in the detection conductor, characterized by:
    means for selectively altering the DC voltage applied to the detection conductor; and
    termination means coupled to the detection conductor and to ground at the remote end of the cable, the termination means having a non-actuated state maintaining an open circuit between the detection conductor and ground and an actuated state connecting the detection conductor to ground, the termination means comprising means responsive to the selective alteration of the DC voltage on the detection conductor to switch the termination means from the non-actuated state to the actuated state.

9. A system according to claim 8 wherein the means for selectively altering the DC voltage comprise means for reversing the polarity of the DC voltage applied to the detection conductor.

10. A monitoring system for a communications cable system including a main cable with a monitored end and a plurality of branch cables coupled to the main cable, each of the main and branch cables having a detection conductor extending therealong, the detection conductors being electrically connected, said monitoring system comprising means for applying a DC voltage to the monitored end of the main cable detection conductor, means for monitoring currents in the main cable detection conductor and a plurality of termination means connected to the respective detection conductors at ends thereof, the system being characterized in that:
    each termination means has a non-actuated state maintaining an open circuit to ground and an actuated state connecting the associated detection conductor to ground; and
    the system includes actuating means for selectively actuating the termination means to the actuated state.

11. A system according to claim 10 wherein the actuating means comprise means for reversing the polarity of the DC voltage applied to the main cable detection conductor.

12. A system according to claim 11 wherein the actuating means comprise means for increasing the DC voltage applied to the conductor.

13. A system according to claim 12 wherein the actuating means further comprise means for applying a selected one of a plurality of coded signals to the monitored end of the main cable and including code responsive means in the termination means for actuating the termination means in response to receipt of respective ones of the coded signals.

14. A system according to claim 10 wherein each termination means comprises means for applying a coded termination signal to the associated detection conductor in response to actuation of the termination means, and including means coupled to the main cable detection conductor at the monitored end for detecting the coded termination signals.

15. A system according to claim 10 wherein each termination means comprises time delay means for delaying operation of the termination means for a pre-selected time, the time delay means of the respective termination means having differing pre-selected time delays such that the termination means are operated sequentially.

16. A system according to claim 10 including means for selectively actuating the individual termination means.

17. A system according to claim 10 including means for sequentially actuating the individual termination means.

18. A termination circuit for a communication cable having a detection conductor extending therealong, said termination circuit comprising:
    monitoring terminal means for connecting the termination circuit to the detection conductor;
    ground terminal means for connecting the termination circuit to ground;
    grounding means for producing a resistance path between the monitoring terminal means and the ground terminal means in response to receipt of an actuating signal at the monitoring terminal means; and
    means for inhibiting operation of the grounding means and maintaining the termination circuit as an open circuit in response to the monitoring terminal means having a negative potential with respect to the ground terminal means.

19. A circuit according to claim 18 comprising means for generating a coded signal and applying the coded signal to the detection conductor.

20. A circuit according to claim 18 wherein the actuating signal is a coded signal and the termination means comprise means for enabling the operation of the grounding means in response to receipt of the coded signal at the monitoring terminal.

21. A circuit according to claim 18 comprising means for inhibiting the operation of the grounding means for a predetermined time after receipt of the actuating signal at the monitoring terminal.

22. A monitoring system for a communications cable system including a main cable with a monitored end and a plurality of branch cables coupled to the main cable at respective splices, each of the main and branch cables having a detection conductor extending therealong, the detection conductors being electrically connected at the splices, said monitoring system comprising means for applying a DC voltage to the monitored end of the main cable detection conductor, a plurality of termination means connected to the respective detection conductors at ends thereof, a plurality of splice sensor units at the respective splices for detecting the presence of moisture at the respective splices and applying encoded signals to the detection conductors, means for monitoring currents in the main cable detection conductor and, means for detecting encoded signals from the splice sensor units, the system being characterized in that:
    each termination means has a non-actuated state maintaining an open circuit to ground and an actuated state connecting the associated detection conductor to ground; and
    the system includes actuating means for selectively actuating the termination means to the actuated state; and
    each termination means comprises means for applying a coded termination signal to the associated detection conductor in response to actuation of the termination means, and including means coupled to the main cable detection conductor at the monitored end for detecting the coded termination signals.

* * * * *